United States Patent
Peng et al.

(10) Patent No.: US 10,468,618 B2
(45) Date of Patent: Nov. 5, 2019

(54) ORGANIC LIGHT-EMITTING DIODE AND PREPARATION METHOD THEREOF, DISPLAY SUBSTRATE AND DISPLAY DEVICE

(71) Applicant: BOE TECHNOLOGY GROUP CO., LTD., Beijing (CN)

(72) Inventors: Cheng Peng, Beijing (CN); Ying Chen, Beijing (CN); Shuyi Liu, Beijing (CN); Franky So, Beijing (CN); Kirk S. Schanze, Beijing (CN); Rajendra Acharya, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 101 days.

(21) Appl. No.: 15/544,071

(22) PCT Filed: Jul. 1, 2016

(86) PCT No.: PCT/CN2016/088122
§ 371 (c)(1),
(2) Date: Jul. 17, 2017

(87) PCT Pub. No.: WO2017/128615
PCT Pub. Date: Aug. 3, 2017

(65) Prior Publication Data
US 2018/0069186 A1   Mar. 8, 2018

(30) Foreign Application Priority Data
Jan. 29, 2016   (CN) .......................... 2016 1 0064237

(51) Int. Cl.
*H01L 51/50* (2006.01)
*H01L 51/56* (2006.01)
(Continued)

(52) U.S. Cl.
CPC ...... *H01L 51/5012* (2013.01); *H01L 51/0059* (2013.01); *H01L 51/0081* (2013.01);
(Continued)

(58) Field of Classification Search
CPC ............ H01L 51/0026; H01L 51/0059; H01L 51/5012; H01L 51/5056; H01L 51/5072;
(Continued)

(56) References Cited

U.S. PATENT DOCUMENTS

2012/0187435 A1    7/2012  Gy
2012/0326136 A1   12/2012  Chen
(Continued)

FOREIGN PATENT DOCUMENTS

CN    101611332 A    12/2009
CN    102449801 A     5/2012
(Continued)

OTHER PUBLICATIONS

International Search Report dated Oct. 28, 2016.
(Continued)

*Primary Examiner* — Matthew E Warren
(74) *Attorney, Agent, or Firm* — Dilworth & Barrese, LLP.; Michael J. Musella, Esq.

(57) ABSTRACT

An organic light-emitting diode and a preparation method thereof, a display substrate, and a display device. The organic light-emitting diode includes a double-layer fold structure, the double-layer fold structure includes a first layer and a second layer adjacent to each other, an interface between the first layer and the second layer and a surface of the second layer farther away from the first layer have a fold morphology, a virtrification transition temperature of the first layer is less than a virtrification transition temperature of the second layer, and a thermal expansion coefficient of the first layer is greater than a thermal expansion coefficient (Continued)

of the second layer. In the organic light-emitting diode, a natural and self-assembled fold morphology can be obtained with a double-layer thin film, to replace an external fold structure, and the resulted device has a higher efficiency and a reduced operating voltage.

20 Claims, 8 Drawing Sheets

(51) Int. Cl.
*H01L 51/00* (2006.01)
*H01L 51/52* (2006.01)
(52) U.S. Cl.
CPC ...... *H01L 51/0082* (2013.01); *H01L 51/5056* (2013.01); *H01L 51/5072* (2013.01); *H01L 51/5092* (2013.01); *H01L 51/5262* (2013.01); *H01L 51/5268* (2013.01); *H01L 51/56* (2013.01); *H01L 51/0026* (2013.01)
(58) Field of Classification Search
CPC .. H01L 51/5092; H01L 51/5268; H01L 51/56
USPC .......................................................... 257/40
See application file for complete search history.

(56) References Cited

U.S. PATENT DOCUMENTS

| | | |
|---|---|---|
| 2012/0326192 A1 | 12/2012 | Van Slyke |
| 2013/0175550 A1 | 7/2013 | Song |
| 2014/0306213 A1* | 10/2014 | Sato ................... H01L 51/5275 257/40 |
| 2015/0171371 A1 | 6/2015 | Jeon |
| 2015/0311474 A1* | 10/2015 | Basil .................. H01L 51/5012 257/40 |

FOREIGN PATENT DOCUMENTS

| | | |
|---|---|---|
| CN | 102842686 A | 12/2012 |
| CN | 104716159 A | 6/2015 |
| CN | 105489785 A | 4/2016 |
| JP | 2002359067 A | 12/2002 |
| JP | 2003243152 A | 8/2003 |
| WO | 2008102487 A1 | 8/2008 |
| WO | 2015164191 A1 | 10/2015 |

OTHER PUBLICATIONS

First Chinese Office Acton dated Dec. 27, 2016.
Second Chinese Office Action dated Aug. 24, 2017.
Extended Search Report dated Jul. 25, 2019 from the European Patent Office.
M. I. Ojovan, Glass Formation in Amorphous SiO2 as a Percolation Phase Transition in a System of Network Defects, JETP Letters, vol. 79, No, 12, Jun. 2014, pp. 632-634.
Poly(dimethysiloxane), https://polymerdatabase.com/polymers/polydimethylsiloxane.html, Copyright 2015 polymerdatabase.com retrieved Jul. 18, 2019.

* cited by examiner

ORGANIC LIGHT-EMITTING DIODE AND PREPARATION METHOD THEREOF, DISPLAY SUBSTRATE AND DISPLAY DEVICE

TECHNICAL FIELD

At least one embodiment of the present disclosure relates to an organic light-emitting diode and a preparation method thereof, a display substrate comprising the organic light-emitting diode, and a display device comprising the display substrate.

BACKGROUND

Organic Light-Emitting Diodes (OLEDs) are very important in applications such as a light-emitting substrate and a display substrate. An OLED generally comprises a plurality of thin organic layers (polymer or a small molecular compound) sandwiched between a pair of electrodes. For example, at least one of these electrodes is transparent for the light emitted.

However, in a common OLED, since light emitted is mostly reflected or absorbed by the interior or an interface of the OLED rather than emitted outwardly, about three quarters of the light is trapped in the interior or at the interface of the OLED, and the external quantum efficiency thereof is less than 25%.

SUMMARY

At least one embodiment of the present disclosure provides an organic light-emitting diode and a preparation method thereof, a display substrate, and a display device; in the organic light-emitting diode, a natural and self-assembled internal fold structure is obtained by using a double-layer organic semiconductor thin film, to replace an external fold structure, resulting in a higher efficiency and a reduced operating voltage.

At least an embodiment of the present disclosure provides an organic light-emitting diode, comprising: a double-layer fold structure, wherein the double-layer fold structure includes a first layer and a second layer adjacent to each other, an interface between the first layer and the second layer and a surface of the second layer farther away from the first layer have a fold morphology, a virtrification transition temperature of the first layer is less than a virtrification transition temperature of the second layer, and a thermal expansion coefficient of the first layer is greater than a thermal expansion coefficient of the second layer.

For example, the organic light-emitting diode according to an embodiment of the present disclosure, farther comprise a cathode and an anode, wherein, the double-layer fold structure is located between the cathode and the anode.

For example, in the organic light-emitting diode according to an embodiment of the present disclosure, the cathode has a fold morphology.

For example, in the organic light-emitting diode according to an embodiment of the present disclosure, the virtrification transition temperature of the first layer is less than or equal to 100° C., and the virtrification transition temperature of the second layer is greater than 100° C.

For example, in the organic light-emitting diode according to an embodiment of the present disclosure, a difference value between the virtrification transition temperature of the first layer and the virtrification transition temperature of the second layer is greater than 50° C.

For example, in the organic light-emitting diode according to an embodiment of the present disclosure, the thermal expansion coefficient of the first layer is greater than $1 \times 10^{-4}$ K-1, and the thermal expansion coefficient of the second layer is less than $5 \times 10^{-5}$ K-1.

For example, in the organic light-emitting diode according to an embodiment of the present disclosure, a thickness of the first layer is greater than a thickness of the second layer.

For example, in the organic light-emitting diode according to an embodiment of the present disclosure, the first layer has a thickness of 20 nm to 100 nm, and the second layer has a thickness of 10 nm to 50 nm.

For example, in the organic light-emitting diode according to an embodiment of the present disclosure, a material of the first layer includes any one of a material of a charge transport layer, a material of a charge injection layer, and a material of a light emitting layer; and a material of the second layer includes any one of the material of the charge transport layer, the material of the charge injection layer and the material of the light emitting layer.

For example, in the organic light-emitting diode according to an embodiment of the present disclosure, the double-layer fold structure includes any one pair of hole injection layer/hole injection layer, hole injection layer/hole transport layer, hole transport layer/hole transport layer, hole injection layer/light emitting layer, hole transport layer/light emitting layer, light emitting layer/light emitting layer, light emitting layer/electron transport layer, electron transport layer/electron transport layer, electron transport layer/electron injection layer, and electron injection layer/electron injection layer.

For example, in the organic light-emitting diode according to an embodiment of the present disclosure, the double-layer fold structure includes any one of N,N'-bis (3-methylphenyl)-N,N'-diphenyl-1,1'-diphenyl-4,4'-diamine (TPD)/4,4',4"-tris(carbazole-9-yl)triphenylamine (TcTa), N,N'-bis (3-methylphenyl)-N,N'-diphenyl-1,1'-diphenyl-4,4'-diamine (TPD)/4,4',4"-tris(carbazole-9-yl)triphenylamine (TcTa) doped with a light-emitting material, 2-(4-diphenyl)-5-(4-tert-butylphenyl)-1,3,4-oxadiazol (PBD)/8-hydroxyquinoline aluminum (Alq3), and N,N'-bis (3-methylphenyl)-N,N'-diphenyl-1,1'-diphenyl-4,4'-diamine (TPD)/8-hydroxyquinoline aluminum (Alq3).

For example, in the organic light-emitting diode according to an embodiment of the present disclosure, the first layer and the second layer are of a small molecular compound or polymer.

For example, in the organic light-emitting diode according to an embodiment of the present disclosure, a ratio (Rz) of peak to valley height in a case of roughness being maximum is greater than 20 nm and less than 1 μm, and a plane period of the fold morphology is 100 nm to 10 μm.

At least an embodiment of the present disclosure provides a preparation method of an organic light-emitting diode, comprising: forming a first layer and a second layer adjacent to each other, and performing an annealing process thereon, so that an interface between the first layer and the second layer and a surface of the second layer farther away from the first layer form a fold morphology, a virtrification transition temperature of the first layer being less than a virtrification transition temperature of the second layer, and a thermal expansion coefficient of the first layer being greater than a thermal expansion coefficient of the second layer.

For example, the preparation method of the organic light-emitting diode according to an embodiment of the present disclosure, further comprises: controlling the fold morphology by controlling at least one of an annealing temperature of the annealing process, materials of the first layer and the second layer, and thicknesses of the first layer and the second layer.

For example, in the preparation method of the organic light-emitting diode according to an embodiment of the present disclosure, the annealing temperature of the annealing process is greater than or equal to the virtrification transition temperature of the first layer, and less than the virtrification transition temperature of the second layer.

For example, in the preparation method of the organic light-emitting diode according to an embodiment of the present disclosure, the virtrification transition temperature of the first layer is less than or equal to 100° C., the virtrification transition temperature of the second layer is greater than 100° C.

For example, in the preparation method of the organic light-emitting diode according to an embodiment of the present disclosure, a difference value between the virtrification transition temperature of the first layer and the virtrification transition temperature of the second layer is greater than 50° C.

For example, in the preparation method of the organic light-emitting diode according to an embodiment of the present disclosure, at the annealing temperature of the annealing process, a thermal expansion coefficient of the first layer is greater than $1\times10^{-4}$ K-1, and a thermal expansion coefficient of the second layer is less than $5\times10^{-5}$ K-1.

For example, in the preparation method of the organic light-emitting diode according to an embodiment of the present disclosure, a thickness of the first layer is greater than a thickness of the second layer.

For example, in the preparation method of the organic light-emitting diode according to an embodiment of the present disclosure, the first layer has a thickness of 20 nm to 100 nm, and the second layer has a thickness of 10 nm to 50 nm.

For example, in the preparation method of the organic light-emitting diode according to an embodiment of the present disclosure, a material of the first layer includes any one of a material of a charge transport layer, a material of a charge injection layer, and a material of a light emitting layer; and a material of the second layer includes any one of the material of the charge transport layer, the material of the charge injection layer and the material of the light emitting layer.

For example, in the preparation method of the organic light-emitting diode according to an embodiment of the present disclosure, the double-layer fold structure includes any one pair of hole injection layer/hole injection layer, hole injection layer/hole transport layer, hole transport layer/hole transport layer, hole injection layer/light emitting layer, hole transport layer/light emitting layer, light emitting layer/light emitting layer, light emitting layer/electron transport layer, electron transport layer/electron transport layer, electron transport layer/electron injection layer, and electron injection layer/electron injection layer.

For example, in the preparation method of the organic light-emitting diode according to an embodiment of the present disclosure, the annealing process is performed under a protective atmosphere.

At least an embodiment of the present disclosure provides an organic light-emitting diode display substrate, comprising the organic light-emitting diode according to any embodiment of the present disclosure.

At least an embodiment of the present disclosure provides an organic light-emitting diode display device, comprising the organic light-emitting diode display substrate according to any embodiment of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMERALS

Figure 1A:
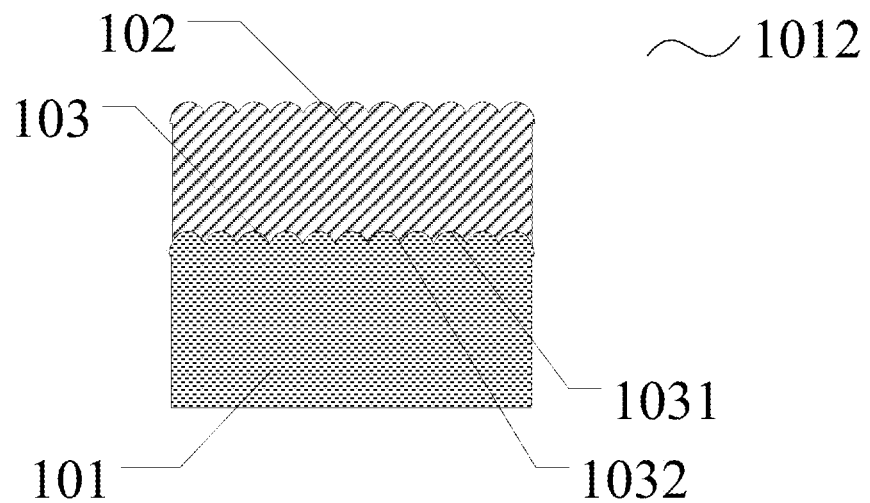
FIG. 1a is a schematic diagram of an internal double-layer fold structure of an organic light-emitting diode (OLED) provided by one embodiment of the present disclosure.

100—organic light—emitting diode; 1012—double-layer fold structure; 101—first layer; 102—second layer; 103—fold morphology; 1031—protrusion; 1032—depression; 10—anode; 20—hole injection layer; 30—hole transport layer; 40—light emitting layer; 50—electron transport layer; 60—electron injection layer; 70—cathode.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The luminescence efficiency of an OLED device is equal to a product of three factors as follows: luminous efficacy radiation (LER), electrical efficiency (EE) and external quantum efficiency (EQE). The external quantum efficiency is also equal to a product of internal quantum efficiency (IQE) and light extraction efficiency (LEE). Among the above-described respective factors, usually it is the light extraction efficiency (LEE) that has a largest room for improvement. A typical organic layer and a typical glass substrate have refractive indices of about 1.8 and about 1.5, respectively, and air has a refractive index of about 1.0. According to the Snell's law, due to existence of total reflection on an interface between different optical media, in an OLED which is not subjected to any light extraction technology, only about 25% of light can be emitted out of the OLED device.

The OLED which is not subjected to any light extraction technology has a low light output efficiency, thus there is need for a technology for extracting light so that the light is emitted outwardly, and otherwise, light will be lost inside the OLED or at an interface of the OLED. This technology is referred to as light extraction technology. A solution by the light extraction technology for overcoming the problem is to minimize the loss of light either inside the OLED or at the interface of the OLED, or remove any factor that impedes propagation of light. Usually, a method used for this purpose comprises an external light extraction technology and an internal light extraction technology.

The external light extraction technology reduces total reflection at an interface between a substrate and the air by forming a fold structure (including depression and protrusion) on an outermost surface of the substrate or by coating the substrate with a layer having a different refractive index from that of the substrate. The internal light extraction technology reduces the waveguide effect by forming a fold structure (including depression and a protrusion) on the surface between the substrate and a transparent electrode or by coating the substrate with a layer having a different refractive index from that of the substrate; and the waveguide effect refers to that light propagates along an interface between layers of different thicknesses and refractive indices rather than propagates forwards.

Although a periodic fold structure approximate to light wavelength used in fabricating a device may increase the light output efficiency, yet formation of the fold structure typically requires a complicated process and subtle control; for example, usually, a method such as photoetching and imprinting may be used; however, these methods are costly and time-consuming, which are not applicable to industrial production. In addition, most of materials used for forming fold are non-conductive.

Moreover, thin film morphology can affect distribution of an electric field; if the fold structure can be controlled independently in a device structure, the electric field can be enhanced by the fold structure of an internal layer to adjust charge balance.

At least one embodiment of the present disclosure provides an organic light-emitting diode, as illustrated in FIG. 1a, comprising a double-layer fold structure 1012, the double-layer fold structure includes a first layer 101 and a second layer 102 adjacent to each other, and an interface between the first layer 101 and the second layer 102 and a surface of the second layer 102 away from the first layer 101 has a fold morphology 103. A virtrification transition temperature of the first layer 101 is less than a virtrification transition temperature of the second layer 102, and a thermal expansion coefficient of the first layer 101 is greater than a thermal expansion coefficient of the second layer 102. For example, through an annealing process, the organic light-emitting diode can obtain the double-layer fold structure 1012 with fold morphology.

For example, the double-layer fold structure 1012 is located inside the organic light-emitting diode. For example, the organic light-emitting diode further comprises a cathode and an anode, and the double-layer fold structure 1012 is located between the cathode and the anode of the organic light-emitting diode. For example, a film layer formed after the double-layer fold structure 1012 also has the fold morphology accordingly, for example, the cathode is a reflective electrode and is formed last, and then the double-layer fold structure 1012 makes the cathode also have the fold morphology. For example, the double-layer fold structure 1012 is located on a base substrate, or, there is further an intermediate layer provided between the double-layer fold structure 1012 and the base substrate, which is not limited here.

For example, the anode is closer to the base substrate than the cathode. For example, the base substrate may be a glass substrate, which is not limited here. For example, the morphology of the double-layer fold structure 1012 is not affected by the layer below the first layer.

For example, surfaces of the second layer closer to the first layer and farther away from the first layer both have a fold morphology, and the first layer 101 and the second layer 102 that are adjacent to each other are closely bonded. The fold morphology 103 includes protrusions (peaks) 1031 and depressions (valleys) 1032. For example, a depression 1032 is between two adjacent protrusions 1031, and a protrusion 1031 is between two adjacent depressions 1032. The fold morphology 103 makes the surface of the first layer which is in contact with the second layer, the surface of the second layer which is in contact with the first layer, and the surface of the second layer farther away from the first layer 101 become rough. For example, Rz (ratio between peak and valley height when a roughness is maximum) is greater than 20 nm and less than 1 μm, further, Rz may be greater than 50 nm and less than 600 nm, and further, Rz may be greater than 100 nm and less than 300 nm. For example, a plane period (e.g., an average distance between highest points of adjacent protrusions in a plane perpendicular to a direction of a layer thickness) of the fold morphology 103 is about 100 nm to 10 μm, further, the plane period of the fold morphology 103 is about 1 μm to 2 μm, and more further, the plane period of the fold morphology 103 is about 500 nm to 800 nm. For example, the plane period of the fold morphology 103 may be about 700 nm to 800 nm. For example, Rz and the plane period may be derived from an atomic force morphology microscopy. In an embodiment of the present disclosure, the atomic force morphology microscopy maps morphology of the surface of the second layer farther away from the first layer.

For example, in an organic light-emitting diode provided by one embodiment of the present disclosure, the virtrification transition temperature of the first layer is less than or equal to 100° C., and the virtrification transition temperature of the second layer is greater than 100° C.

For example, in an organic light-emitting diode provided by an embodiment of the present disclosure, the difference value between the virtrification transition temperature of the first layer and the virtrification transition temperature of the second layer may be greater than 50° C. In some examples, the difference value between the virtrification transition temperature of the first layer and the virtrification transition temperature of the second layer is greater than 70° C. In other examples, the difference value between the virtrification transition temperature of the first layer and the virtrification transition temperature of the second layer is greater than 80° C.

For example, in an organic light-emitting diode provided by an embodiment of the present disclosure, the thermal expansion coefficient of the first layer is greater than $1 \times 10^{-4}$ $K^{-1}$, and the thermal expansion coefficient of the second layer is less than $5 \times 10^{-5}$ $K^{-1}$.

For example, the difference of the virtrification transition temperatures and the difference of the thermal expansion coefficients between the first layer and second layer are given above, so that, in the annealing process, after thermal expansion, and under an action of stress, the interface between the first layer and the second layer and the surface of the second layer farther away from the first layer form a fold morphology. In addition, the above-described differences in the virtrification transition temperatures and the thermal expansion coefficients may be advantageous to generate a uniform and periodic fold morphology.

For example, in an organic light-emitting diode provided by an embodiment of the present disclosure, a thickness of the first layer is greater than a thickness of the second layer. For example, in an organic light-emitting diode provided by an embodiment of the present disclosure, the first layer has a thickness of 20 nm to 100 nm, and the second layer has a thickness of 10 nm to 50 nm.

Figure 1B:
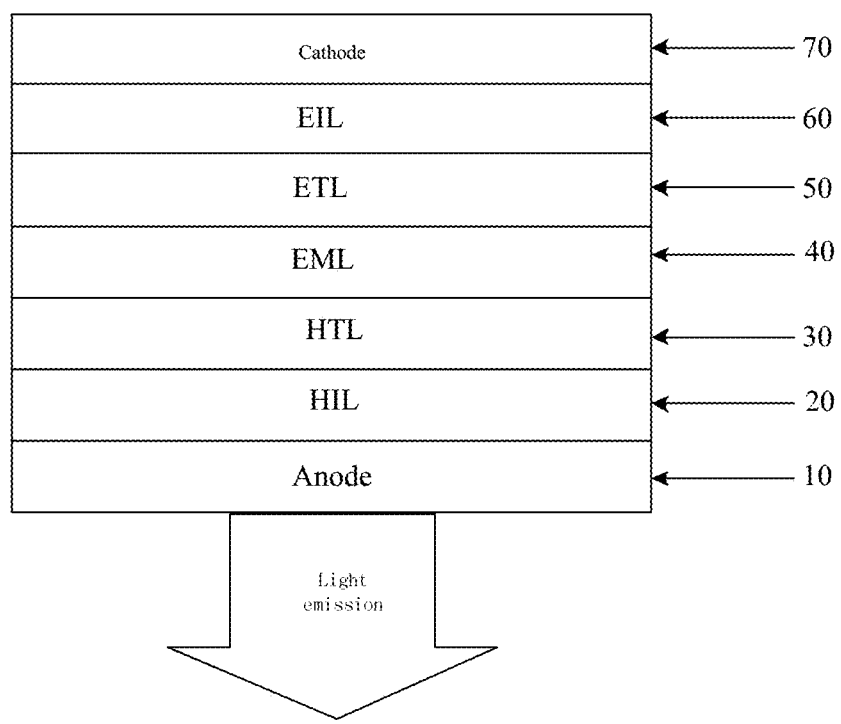
FIG. 1b is a schematic diagram of a laminated structure of an OLED.

FIG. 1*b* shows an organic light-emitting diode 100, comprising an anode 10, a hole injection layer (HIL) 20, a hole transport layer (HTL) 30, a light emitting layer (EML) 40, an electron transport layer (ETL) 50, an electron injection layer (EIL) 60, and a cathode 70. For example, the above-described respective layers may be sequentially laminated. It should be noted that, in an organic light-emitting diode 100 provided by another embodiment, at least one of the hole injection layer (HIL) 20, the hole transport layer (HTL) 30, the electron transport layer (ETL) 50 and the electron injection layer (EIL) 60 may not be provided. In addition, the above-described laminated structure is only illustrative, and the organic light-emitting diode according to an embodiment of the present disclosure may have some of the above-described layers reduced, or may also have other layers added. For example, a hole blocking layer, an electron blocking layer, and the like, may also be comprised. FIG. 1*b* shows an organic light-emitting diode having a normal structure (in which light is emitted out from a surface on which the anode is located), and an inverted structure (in which light is emitted out from a surface on which the cathode is located) and a transparent structure (light emitted out from both sides) may also be used. According to the embodiments of the present disclosure, any two adjacent layers in the organic light-emitting diode may be selected for forming a double-layer fold structure. In addition, in the double-layer fold structure of the organic light-emitting diode provided by an embodiment of the present disclosure, a double-layer electron transport layer (both the first layer and the second layer are electron transport layers), a double-layer hole transport layer (both the first layer and the second layer are hole transport layers) and a double-layer light emitting layer (both the first layer and the second layer are light emitting layers) may also be used, which will not be limited by the present disclosure.

For example, in the organic light-emitting diode provided by an embodiment of the present disclosure, the double-layer fold structure may be used directly as a functional layer in the organic light-emitting diode 100, or the double-layer fold structure provided by the embodiment of the present disclosure may also be added in an appropriate position in the organic light-emitting diode laminated layer, which will limit the present disclosure. The functional layer includes: for example, a hole injection layer (HIL) 20, a hole transport layer (HTL) 30, a light emitting layer (EML) 40, an electron transport layer (ETL) 50, an electron injection layer (EIL) 60, etc. Any double-layer fold structure given by an embodiment of the present disclosure may be multiplexed or reused as a portion of the functional layers in the organic light-emitting diode, and for remaining functional layers, a conventional design may be adopted on the basis of the embodiment of the present disclosure. Of course, the double-layer fold structure may not be multiplexed or reused as a functional layer, but as a layer structure added in an appropriate position in the organic light-emitting diode.

For example, in the organic light-emitting diode provided by one embodiment of the present disclosure, the material of the first layer includes any one of a material of a charge transport layer, a material of a charge injection layer, and a material of a light emitting layer; and the material of the second layer includes any one of the material of the charge transport layer, the material of the charge injection layer and the material of the light emitting layer. For example, the charge transport layer may include an electron transport layer and a hole transport layer, and the charge injection layer may include an electron injection layer and a hole injection layer. The embodiments described below may be the same in this aspect. The materials of the first layer and the second layer may be selected from among the above-described several types of materials; and hereinafter, several which may be used as the material of the first layer and the material of the second layer are illustrated below, but the disclosure is not limited thereto.

For example, the material of the hole transport layer and the material of the hole injection layer may include one or more of aromatic diamine compound, triphenylamine compound, aromatic triamine compound, biphenylenediamine derivative, triarylamine polymer and carbazole polymer. For example, the material of the hole transport layer includes any one or more of 4,4'-N,N'-dicarbazole biphenyl (CBP), 4,4',4''-tris(carbazole-9-yl)triphenylamine (TcTa), 9,9'-(1,3-phenyl) bis-9H-carbazole (mCP), N,N'-bis (1-naphthyl)-N, N'-diphenyl-1,1'-diphenyl-4,4'-diamine (NPB), 4,4',4''-tris (N-3-methylphenyl-N-phenylamino) triphenylamine (m-MTDATA), 4,4-2-[N-(4-phenyl carbazole)-N-phenylamine] biphenyl (CPB), N,N'-bis (3-methylphenyl)-N, N'-diphenyl-1,1'-diphenyl-4,4'-diamine (TPD), and polyvinyl carbazole or a monomer thereof.

For example, the material of the hole injection layer may include any one or more of a triphenylamine compound and a p-type doped organic layer or a p-type doped polymer; for example, the material of the hole injection layer includes any one or more of tris-4-(5-phenyl-2-thiophene) benzene] amine, 4,4',4''-tris [2-naphthyl (phenyl) amino] triphenylamine (2-TNATA), 4,4',4''-tris-(3-methylphenylanilino) triphenylamine (m-MTDATA), copper phthalocyanine (CuPc), PEDOT:PSS, and 4,4',4''-tris(N-3-methylphenyl-phenylamino) triphenylamine (F4TCNQ).

For example, the material of the electron transport layer and the material of the electron injection layer include an organic small molecular material or an organic polymer material; for example, the material of the electron transport layer and the material of the electron injection layer include any one or more of o-phenanthroline derivative, oxazole derivative, thiazole derivative, imidazole derivative, metal complex and anthracene derivative. For example, the material of the electron transport layer and the material of the electron injection layer may include: any one or more of 4,6-bis (3,5-di(3-pyridyl) phenylphenyl-2-methylpyrimidine) (B3PymPm), 4,7-diphenyl-1,10-orthophenanthrolene (BPhen), 8-hydroxyquinoline aluminum (Alq$_3$), 8-hydroxyquinoline lithium (Liq), 8-quinolinolato gallium, bis[2-(2-hydroxyphenyl-1)-pyridine] beryllium, 2-(4-diphenyl)-5-(4-tert-butylphenyl)-1,3,4-oxadiazol(PBD), and 1,3,5-tris (N-phenyl-2-benzimidazole-2) benzene (TPBI).

For example, the light emitting layer, according to different organic light-emitting materials used therefor, may emit red light, green light, blue light, yellow light, white light, or the like. The organic light-emitting material includes either of a fluorescent light-emitting material or a phosphorescent light-emitting material; for example, a doping system may be used, that is, a dopant material may be mixed into a host light-emitting material to obtain a usable material of the light emitting layer. The phosphorescent light-emitting material, for example, includes a metal complex light-emitting material based on Ir, Pt, Ru, Cu, or the like. For example, a red phosphorescent material includes any one of platinum octaethylporphyrin (PtOEP), bis (2-(2'-benzothienyl) pyridine-N,C3') (acetylacetonato) iridium [(btp)$_2$Ir (acac)], and tris (dibenzoylmethane) mono (phenanthroline) Europium (III) [Eu(dbm)$_3$(Phen)], tris[1-phenylisoquinoline-C2,N) iridium (III) (Ir(piq)$_3$), bis(1-phenyl isoquinoline)(acetylacetone) iridium (III) [Ir(piq)$_2$(acac)]. For example, a green phosphorescent material includes tris (2-phenylpyridine) iridium (Ir(ppy)$_3$), acetyl acetone acid bis(2-phenylpyridine) iridium [Ir(ppy)$_2$(acac)], tris(2-phenylpyridine) iridium (III)(Ir(mppy)$_3$), acetyl acetone acid bis(2-phenylpyridine) iridium [Ir(FPP)$_2$(acac)], and tris(2-phenylpyridine) iridium (Ir(Bu-ppy)$_3$). In addition, the light-emitting material may further include an example of co-host material doping system.

The material of the hole transport layer, the material of the hole injection layer, the material of the light emitting layer, the material of the electron transport layer, the material of the electron injection layer and the like, for forming the double-layer fold structure, can be selected from the materials given above, but are not limited thereto.

For example, in an organic light-emitting diode provided by an embodiment of the present disclosure, the double-layer fold structure includes any pair of hole injection layer/hole injection layer, hole injection layer/hole transport layer, hole transport layer/hole transport layer, hole injection layer/light emitting layer, hole transport layer/light emitting layer, light emitting layer/light emitting layer, light emitting layer/electron transport layer, electron transport layer/electron transport layer, electron transport layer/electron injection layer, and electron injection layer/electron injection layer, to which the disclosure is not limited. In the embodiment of the present disclosure, the expression "A/B" represents a double-layer structure in the first layer and the second layer, for example, A represents one of the first layer and the second layer, and B represents the other of the first layer and the second layer.

For example, in an organic light-emitting diode provided by one embodiment of the present disclosure, the double-layer fold structure includes any one of TPD/TcTa, TPD/TcTa doped with a light-emitting material, PBD/Alq$_3$, TPD/Alq$_3$, and the like.

For example, in an organic light-emitting diode provided by one embodiment of the present disclosure, the first layer and the second layer are layers of small molecular compound or polymer. For example, the first layer and the second layer are two organic layers inside the organic light-emitting diode.

In the organic light-emitting diode provided by at least one embodiment of the present disclosure, a natural and self-assembled fold structure is generated with a double-layer structure (e.g., a double-layer organic semiconductor thin film), to replace the external fold structure, resulting in a higher efficiency and a reduced operating voltage.

Figure 1C:
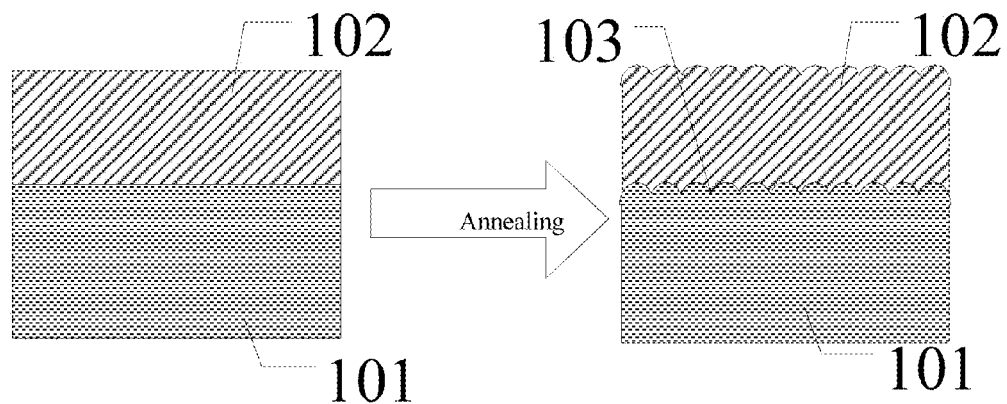
FIG. 1c is a schematic diagram of a preparation method of an OLED provided by an embodiment of the present disclosure.

At least one embodiment of the present disclosure further provides a preparation method of an organic light-emitting diode, comprising: forming a first layer 101 and a second layer 102 adjacent to each other, and performing an annealing process thereon (as illustrated in FIG. 1c), so that an interface between the first layer 101 and the second layer 102 and a surface of the second layer 102 farther away from the first layer 101 form a fold morphology 103; a virtrification transition temperature of the first layer is less than a virtrification transition temperature of the second layer, and a thermal expansion coefficient of the first layer is greater than a thermal expansion coefficient of the second layer.

For example, a preparation method of an organic light-emitting diode provided by an embodiment of the present disclosure further comprises controlling the fold morphology by controlling at least one of an annealing temperature of the annealing process, materials of the first layer and the second layer, and thicknesses of the first layer and the second layer.

For example, formation of the interface having the fold morphology is not affected by respective layers on the other side of the first layer opposite to the second layer.

Figure 1D:
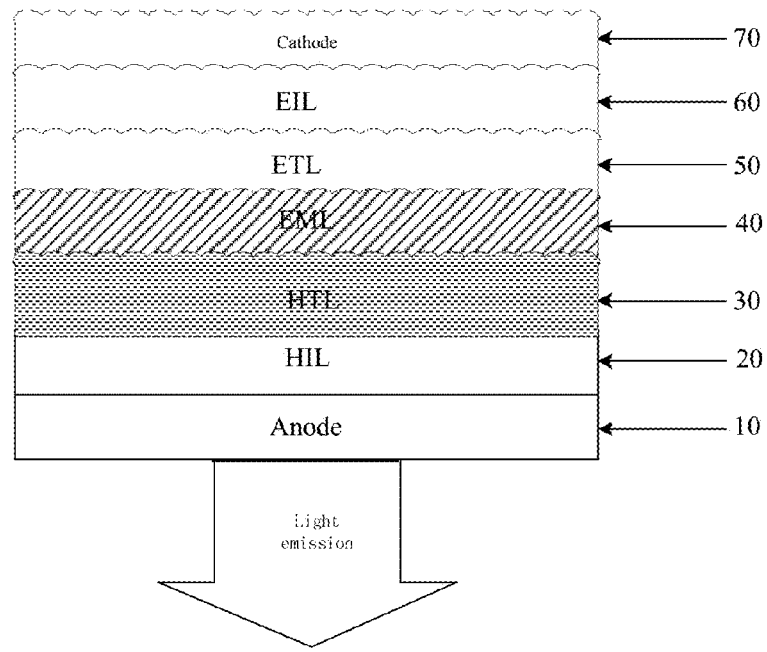
FIG. 1d is a schematic diagram of a laminated structure of an OLED of a double-layer fold structure constituted by a hole transport layer (HTL) and a light emitting layer (EML) provided by an embodiment of the present disclosure.

For example, a subsequently formed film layer may replicate the above-described morphology, i.e., also has the fold morphology; for example, two surfaces of the subsequent film layer formed after the formation of the above-described fold morphology both have the fold morphology, as illustrated in FIG. 1d. For example, the subsequent film layer has the fold morphology, so that the cathode may also have the fold morphology. FIG. 1d shows a schematic diagram of a double-layer fold structure constituted by a hole transport layer (HTL) 30 and a light emitting layer (EML) 40 in the organic light-emitting diode 100. It should be noted that, the organic light-emitting diode provided by the embodiment of the present disclosure is not limited to the structure as shown in FIG. 1d.

For example, in a preparation method of an organic light-emitting diode provided by an embodiment of the present disclosure, the annealing temperature of the annealing process is greater than or equal to the virtrification transition temperature of the first layer, and less than the virtrification transition temperature of the second layer. For example, the annealing temperature may be less than 150° C., further, the annealing temperature may be less than 120° C., and more further, the annealing temperature may be less than 90° C. For example, the annealing temperature may be 8° C. to 40° C. higher than the virtrification transition temperature of the first layer, and further, for example, the annealing temperature may be 10° C. to 30° C. higher than the virtrification transition temperature of the first layer.

For example, in a preparation method of an organic light-emitting diode provided by an embodiment of the present disclosure, the virtrification transition temperature of the first layer is less than or equal to 100° C., and the virtrification transition temperature of the second layer is greater than 100° C. Further, the virtrification transition temperature of the first layer is less than or equal to 80° C., and the virtrification transition temperature of the second layer is greater than 120° C. More further, the virtrification transition temperature of the first layer is less than or equal to 70° C., and the virtrification transition temperature of the second layer is greater than 140° C.

For example, in a preparation method of an organic light-emitting diode provided by an embodiment of the present disclosure, a difference value between the virtrification transition temperature of the first layer and the virtrification transition temperature of the second layer may be greater than 50° C.

For example, in a preparation method of an organic light-emitting diode provided by an embodiment of the present disclosure, at the annealing temperature of the annealing process, a thermal expansion coefficient of the first layer is greater than $1 \times 10^{-4}$ $K^{-1}$, and a thermal expansion coefficient of the second layer is less than $5 \times 10^{-5}$ $K^{-1}$.

For example, in a preparation method of an organic light-emitting diode provided by an embodiment of the present disclosure, a thickness of the first layer is greater than a thickness of the second layer.

For example, in a preparation method of an organic light-emitting diode provided by an embodiment of the present disclosure, the first layer has a thickness of 20 nm to 100 nm, and the second layer has a thickness of 10 nm to 50 nm.

For example, in a preparation method of an organic light-emitting diode provided by one embodiment of the present disclosure, a material of the first layer includes any one of a material of a charge transport layer, a material of a charge injection layer, and a material of a light emitting layer; and a material of the second layer includes any one of the material of the charge transport layer, the material of the charge injection layer, and the material of the light emitting layer.

For example, in a preparation method of an organic light-emitting diode provided by an embodiment of the present disclosure, the double-layer structure of the first layer and the second layer includes the pair such as hole injection layer/hole injection layer, hole injection layer/hole transport layer, hole transport layer/hole transport layer, hole injection layer/light emitting layer, hole transport layer/light emitting layer, light emitting layer/light emitting layer, light emitting layer/electron transport layer, electron transport layer/electron transport layer, electron transport layer/electron injection layer, and electron injection layer/electron injection layer, to which the disclosure is not limited.

For example, in a preparation method of an organic light-emitting diode provided by an embodiment of the present disclosure, the annealing process is performed under a protective atmosphere. The protective atmosphere, for example, makes both contents of a water molecule and an oxygen molecule in an annealing atmosphere less than 1 ppm. The protective atmosphere includes, for example, any one of a vacuum atmosphere, a nitrogen atmosphere, an argon gas atmosphere and a helium atmosphere, to which the disclosure is not limited.

For example, in a preparation method of an organic light-emitting diode provided by an embodiment of the present disclosure, for the virtrification transition temperature of the first layer, the virtrification transition temperature of the second layer, the difference value between the virtrification transition temperature of the first layer and the virtrification transition temperature of the second layer, the thermal expansion coefficient of the first layer, the thermal expansion coefficient of the second layer, the thickness of the first layer, the thickness of the second layer, function of the first layer and selection of the material thereof, function of the second layer and selection of the material thereof, corresponding description in the above-described organic light-emitting diode may be referred to. Thus, a corresponding organic light-emitting diode may be formed.

In at least one embodiment of the present disclosure, an integrated OLED internal fold structure is prepared by a new method, that is, a natural and self-assembled fold structure is obtained with a double-layer thin film (e.g., a double-layer organic semiconductor thin film), by a thermal process (an annealing process).

In the embodiment of the present disclosure, terms related to the virtrification transition temperature and the thermal expansion coefficient are explained below.

(1) Virtrification transition temperature: virtrification transition is an inherent property of an amorphous material (for example, including an organic small molecular material or a polymer material), and is a macroscopic manifestation of the molecular movement form, which directly affects application performance and process performance of the material. The vast majority of small molecular materials or polymer materials may usually be in four physical states (or referred to as mechanical states) as follows: vitreous state, viscoelastic state, high-elastic state (rubber-like state) and viscous state. However, virtrification transition is a transition between the high-elastic state and the vitreous state. The temperature corresponding to virtrification transition is the virtrification transition temperature. In view of molecular structure, the virtrification transition temperature is a relaxation phenomenon of small molecules or polymers in amorphous part from a frozen state to a thawing state. Below the virtrification transition temperature, the polymer is in the vitreous state, and therefore neither molecular chains nor chain segments can move, so that atoms (or groups) constituting the molecules vibrate at their equilibrium positions. But at the virtrification transition temperature, although the molecular chains cannot move, the chain segments begin to move, showing a high-elastic property, and if the temperature further rises, the whole molecular chains move and shows a viscous property. The virtrification transition temperature ($T_g$) is an important physical property of amorphous small molecule or polymer. For example, the virtrification transition temperature of each amorphous substance may be obtained by thermal analysis.

(2) Thermal expansion coefficient: due to temperature changes, an object presents an expansion-shrinkage phenomenon, and generally it involves a linear expansion coefficient, a surface expansion coefficient and a volume expansion coefficient; here, it is described with the linear expansion coefficient, that is, a ratio of change in a length of a solid when the temperature changes by 1 Celsius degree to a length when it is at 0° C., and its unit is 1/° C. (1/K). For example, in an embodiment of the present disclosure, linear expansion coefficients of the first layer and the second layer are average linear expansion coefficients of the first layer and the second layer at a temperature around the annealing temperature set during the annealing process. For example, the temperature around the annealing temperature may refer to ±5° C. around the annealing temperature. In a case of it being around the virtrification transition temperature or greater than the virtrification transition temperature, the thermal expansion coefficient of the substance may change to a larger extent.

Hereinafter, it is illustrated with reference to several embodiments.

Embodiment One

This embodiment provides an organic light-emitting diode 100, as illustrated in FIG. 1a, the organic light-emitting diode 100 comprises a double-layer fold structure 1012, the double-layer fold structure including a first layer 101 and a second layer 102 adjacent to each other, an interface between the first layer 101 and the second layer 102 and a surface of the second layer 102 farther away from the first layer 101 have a fold morphology 103, a virtrification transition temperature of the first layer 101 is less than a virtrification transition temperature of the second layer 102, and a thermal expansion coefficient of the first layer 101 is greater than a thermal expansion coefficient of the second layer 102. For example, the organic light-emitting diode may be an organic electroluminescent diode, and respective embodiments below may be the same in this aspect.

For example, a preparation method of the above-described organic light-emitting diode is as follows: the method comprises forming a first layer and a second layer adjacent to each other, and performing an annealing process thereon (as illustrated in FIG. 1c), so that an interface between the first layer and the second layer and a surface of the second layer farther away from the first layer form a fold morphology, a virtrification transition temperature of the first layer is less than a virtrification transition temperature of the second layer, and a thermal expansion coefficient of the first layer is greater than a thermal expansion coefficient of the second layer.

For example, in one example of this embodiment, the virtrification transition temperature of the first layer 101 is less than or equal to 100° C., and the virtrification transition temperature of the second layer 102 is greater than 100° C. For example, a material of the first layer includes PBD material for electron transport layer, $Alq_3$ material for electron transport layer, NPB material for hole transport layer, and TPD material for hole transport layer; a virtrification transition temperature of PBD is about 60° C., a virtrification transition temperature of $Alq_3$ is 170° C., a virtrification transition temperature of NPB is about 95° C., and a virtrification transition temperature of TPD is about 60° C. A material of the second layer includes TcTa material for hole transport layer, and a material of light emitting layer with the material for hole transport layer as a host material, a virtrification transition temperature of TcTa is about 150° C., and because the doping amount of this material in the light-emitting material is relatively small, a virtrification transition temperature and an expansion coefficient of the host material may be referred to the virtrification transition temperature and the expansion coefficient of the material of the light emitting layer.

For example, in the organic light-emitting diode provided by an example of this embodiment, at an annealing temperature of the annealing process, a ratio of the thermal expansion coefficient of the first layer 101 to the thermal expansion coefficient of the second layer is greater than 2; further, for example, the ratio of the thermal expansion coefficient of the first layer 101 to the thermal expansion coefficient of the second layer is greater than 10; and more further, for example, the ratio of the thermal expansion coefficient of the first layer 101 to the thermal expansion coefficient of the second layer is greater than 20. For example, the thermal expansion coefficient of the first layer 101 (a linear expansion coefficient $\alpha_L$, the following may be the same in this aspect) is greater than $1 \times 10^{-4}$ $K^{-1}$, and the thermal expansion coefficient of the second layer (a linear expansion coefficient $\alpha_L$, the following may be the same in this aspect) is less than $5 \times 10^{-5}$ $K^{-1}$; further, for example, the thermal expansion coefficient of the first layer 101 is greater than $5 \times 10^{-4}$ $K^{-1}$, and the thermal expansion coefficient of the second layer is less than $3 \times 10^{-5}$ $K^{-1}$; and more further, the thermal expansion coefficient of the first layer 101 is greater than $1 \times 10^{-3}$ $K^{-1}$, and the thermal expansion coefficient of the second layer is less than $1 \times 10^{-5}$ $K^{-1}$. For example, in a case where TPD is at a temperature greater than its virtrification transition temperature, the linear expansion coefficient $\alpha_L$ is about $1 \times 10^{-3}$ $K^{-1}$, and $Alq_3$ at a temperature of 70° C. has a linear expansion coefficient $\alpha_L$ of about $3 \times 10^{-5}$ $K^{-1}$.

Figure 2A:
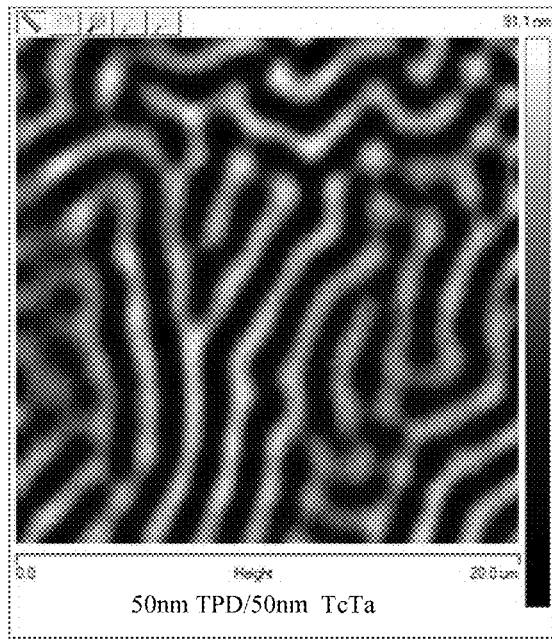
FIG. 2a and FIG. 2b are respectively atomic force morphology microscopies with a scan size of 20 μm×20 μm, after hole transport layer TPD (thickness 50 nm)/hole transport layer TcTa (thickness 50 nm), and hole transport layer TPD (thickness 80 nm)/hole transport layer TcTa (thickness 50 nm) are annealed at 85° C. for 30 minutes in an OLED provided by an embodiment of the present disclosure.
Figure 2B:
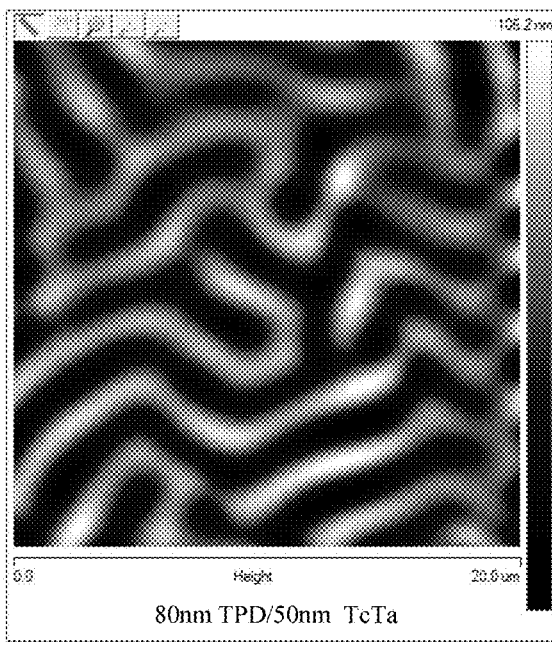

For example, in the organic light-emitting diode provided by an example of this embodiment, the material of the first layer is TPD and the material of the second layer is TcTa, FIG. 2a and FIG. 2b respectively show atomic force morphology microscopies of a double-layer structure with a scan size of 20 μm×20 μm, with a hole transport layer TPD (thickness 50 nm or 80 nm) (with a virtrification transition temperature of about 60° C., and a linear expansion coefficient at a temperature of 85° C. greater than $1 \times 10^{-4}$ $K^{-1}$, i.e., about $1 \times 10^{-4}$ $K^{-1}$) as the first layer, and with a hole transport layer TcTa (thickness 50 nm) (with a virtrification transition temperature of about 150° C., and a linear expansion coefficient at a temperature of 85° C. less than $5\times10^{-5}$ $K^{-1}$) as the second layer, after the double-layer structure is annealed at 85° C. for 30 minutes and then cooled to the room temperature. From FIG. 2a and FIG. 2b, it can be seen that a fold morphology is generated, the double-layer structure constituted by the first layer and the second layer form a fold structure; in the drawing, the position with greater luminance represents a protrusion, and the position with less luminance represents a depression, the protrusions and the depressions are adjacent to each other, and Rz is about 70 nm to 80 nm. The fold morphology formed by hole transport layer TPD (thickness 50 nm)/hole transport layer TcTa (thickness 50 nm) is better than the fold morphology formed by hole transport layer TPD (thickness 80 nm)/hole transport layer TcTa (thickness 50 nm), because its plane period is relatively small.

Figure 3A:
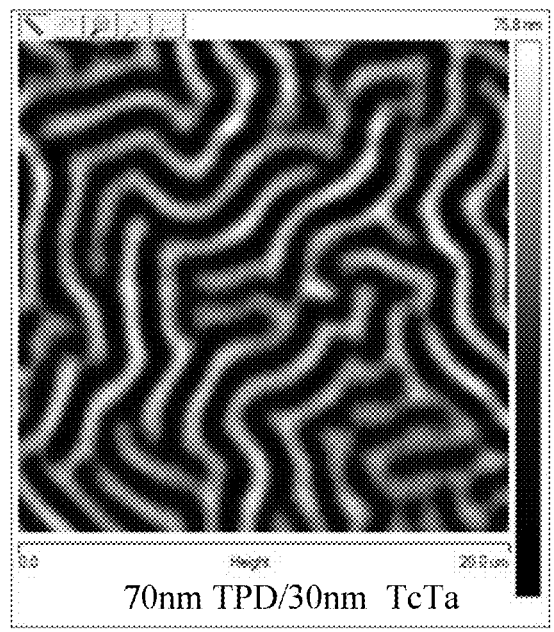
FIG. 3a and FIG. 3b are respectively atomic force morphology microscopies with a scan size of 20 μm×20 μm, after hole transport layer TPD (thickness 70 nm)/30 nm-thick hole transport layer TcTa, and hole transport layer TPD (thickness 70 nm)/hole transport layer TcTa (thickness 60 nm) are annealed at 85° C. for 30 minutes in an OLED provided by one embodiment of the present disclosure.
Figure 3B:
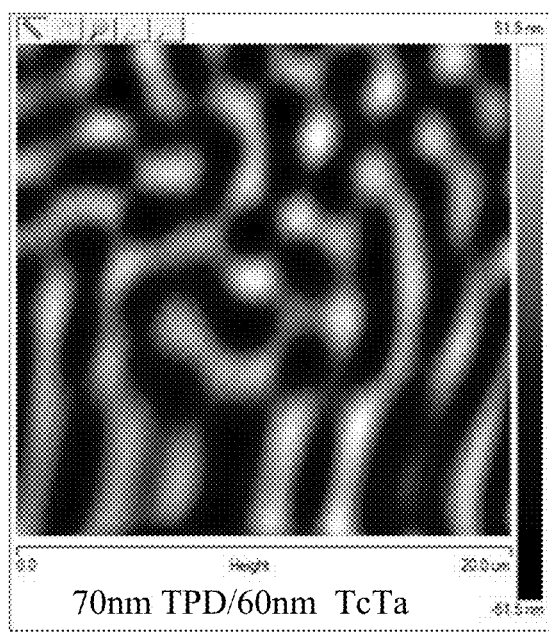

For example, in the organic light-emitting diode provided by an example of this embodiment, the material of the first layer is TPD and the material of the second layer is TcTa, FIG. 3a and FIG. 3b respectively show atomic force morphology microscopies of a double-layer structure, with a TPD hole transport layer (thickness 70 nm) (with a virtrification transition temperature of about 60° C., and a linear expansion coefficient at a temperature of 85° C. greater than $1\times10^{-4}$ $K^{-1}$) as the first layer, and with a TcTa hole transport layer (thickness 30 nm or 60 nm) (with a virtrification transition temperature of about 150° C., and a linear expansion coefficient at a temperature of 85° C. less than $5\times10^{-5}$ $K^{-1}$) as the second layer, after the double-layer structure is annealed at 85° C. for 30 minutes and then cooled to the room temperature. Its scan size is 20 μm×20 μm. From FIG. 3a and FIG. 3b, it can be seen that the double-layer structure constituted by the first layer and the second layer form a fold structure; in the drawing, the position with greater luminance represents a protrusion, and the position with less luminance represents a depression, the protrusions and the depressions are adjacent to each other, and Rz of the fold morphology of the double-layer fold structure constituted by TPD hole transport layer (thickness 70 nm)/TcTa hole transport layer (thickness 30 nm) is about 50 nm to 60 nm, and Rz of the fold morphology of the double-layer fold structure constituted by a TPD hole transport layer (thickness 70 nm)/a TcTa hole transport layer (thickness 60 nm) is about 70 nm to 80 nm. In a case where TPD hole transport layer has a given thickness, the smaller the thickness of the hole transport layer TcTa, the larger the density of the fold formed, the more obvious the fold morphology becomes, the clearer the boundary of protrusions and depressions is, and the more easily to form the fold configuration. That is, in a case where the materials of the first layer and the second layer are selected, and under the premise that a given thickness is satisfied, the smaller the thickness of the second layer, the more easily to form the fold configuration, and the more obvious the fold morphology.

Figure 4:
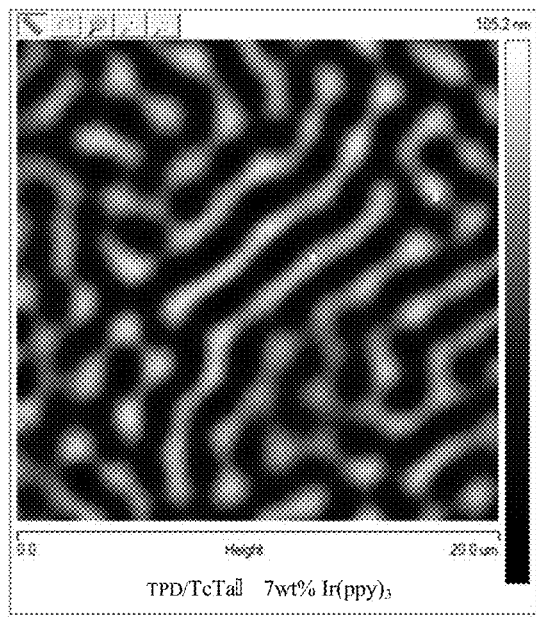
FIG. 4 is an atomic force morphology microscopy with a scan size of 20 μm×20 μm, after hole transport layer TPD (thickness 70 nm)/light emitting layer TcTa (thickness 45 nm): 7 wt % Ir(ppy)$_3$ is annealed at 85° C. for 30 minutes in an OLED provided by an embodiment of the present disclosure.

For example, in the organic light-emitting diode provided by an example of this embodiment, the material of the first layer is TPD and the material of the second layer is TcTa: 7 wt % Ir(ppy)$_3$, as illustrated in FIG. 4, it is an atomic force morphology microscopy of a double-layer structure with a scan size of 20 μm×20 μm, with a TPD hole transport layer (thickness 70 nm) (with a virtrification transition temperature of about 60° C., and a linear expansion coefficient at a temperature of 85° C. greater than $1\times10^{-4}$ $K^{-1}$, i.e., about $1\times10^{-4}$ $K^{-1}$) as the first layer, and with a TcTa light emitting layer (thickness 45 nm): 7 wt % Ir(ppy)$_3$ (TcTa doped with 7 wt % Ir(ppy)$_3$, with a virtrification transition temperature of about 150° C., and a linear expansion coefficient at a temperature of 85° C. less than $5\times10^{-5}$ $K^{-1}$) as the second layer, after the double-layer structure is annealed at 85° C. for 30 minutes and then cooled to a room temperature. From FIG. 4, it can be seen that, the double-layer structure constituted by the first layer and the second layer form a fold structure, Rz is about 70 nm to 80 nm; in the drawing, the position with greater luminance represents a protrusion, and the position with less luminance represents a depression, the protrusions and the depressions are adjacent to each other.

For example, in one example of this embodiment, the first layer 101 and the second layer 102 in the organic light-emitting diode may be of small molecular compound or polymer.

Figure 5A:
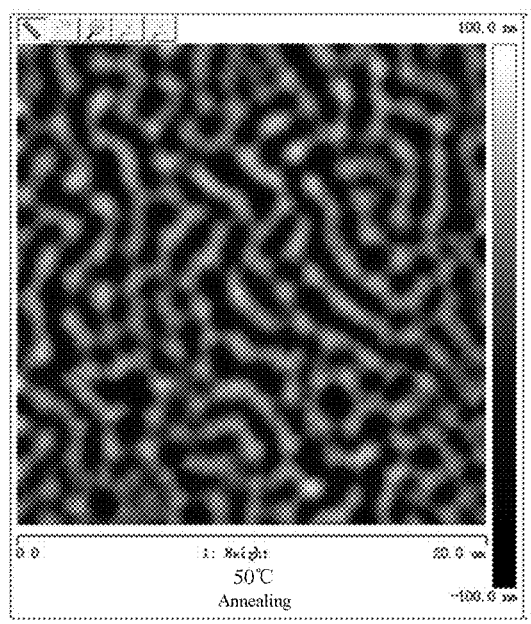
FIG. 5a and FIG. 5b are respectively atomic force morphology microscopies with a scan size of 20 μm×20 μm, after hole transport layer PBD (thickness 50 nm)/electron transport layer Alq3 (thickness 20 nm) is annealed at 50° C. or 60° C. for 30 minutes in an OLED provided by an embodiment of the present disclosure.
Figure 5B:
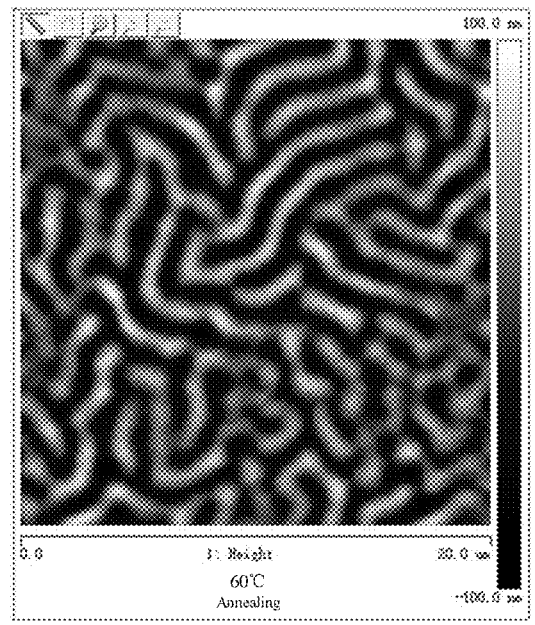

For example, in an example of this embodiment, the material of the first layer is PBD and the material of the second layer is Alq3, FIG. 5a and FIG. 5b respectively show atomic force morphology microscopies of a double-layer structure with a scan size of 20 μm×20 μm, with a PBD electron transport layer (thickness 50 nm) (with a virtrification transition temperature of about 60° C., and a linear expansion coefficient at an annealing temperature greater than $1\times10^{-4}$ $K^{-1}$) as the first layer, and with an Alq3 electron transport layer (thickness 20 nm)(with a virtrification transition temperature of about 170° C., and a linear expansion coefficient at an annealing temperature of about $3\times10^{-5}$ $K^{-1}$) as the second layer, after the double-layer structure is annealed at 50° C. or 60° C. for 30 minutes and then cooled to a room temperature. From FIG. 5a and FIG. 5b, it can be seen that, the double-layer structure constituted by the first layer and the second layer generate fold structure; in the diagram, the position with greater luminance represents a protrusion, and the position with less luminance represents a depression, the protrusions and the depressions are adjacent to each other, and Rz is about 90 nm to 100 nm. With same annealing time and the same magnitude of enlargement in view, the fold formed at an annealing temperature of 60° C. is larger than a fold formed at an annealing temperature of 50° C., the fold morphology is more obvious, and the boundary between the protrusions and depressions is clearer. For example, within a given range, by increasing the annealing temperature, the second layer may have a better formed fold morphology.

Figure 6A:
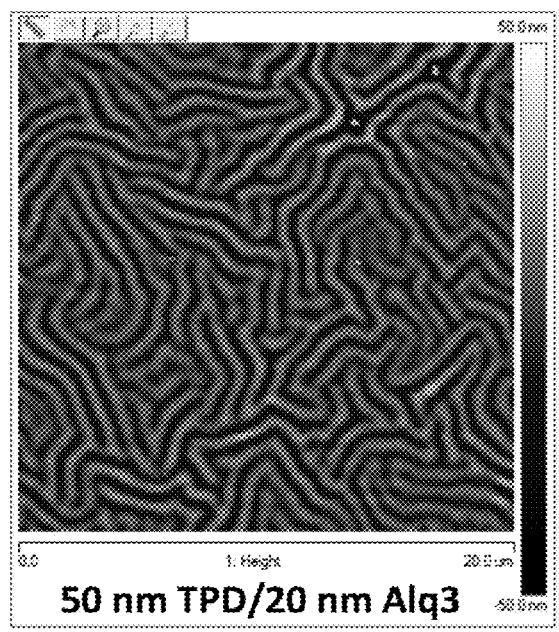
FIG. 6a and FIG. 6b are respectively atomic force morphology microscopies with a scan size of 20 μm×20 μm, after hole transport layer TPD (thickness 50 nm)/electron transport layer Alq3 (thickness 20 nm) and hole transport layer TPD (thickness 70 nm)/electron transport layer Alq3 (thickness 20 nm) are annealed at 70° C. for 30 minutes in an OLED provided by an embodiment of the present disclosure.
Figure 6B:
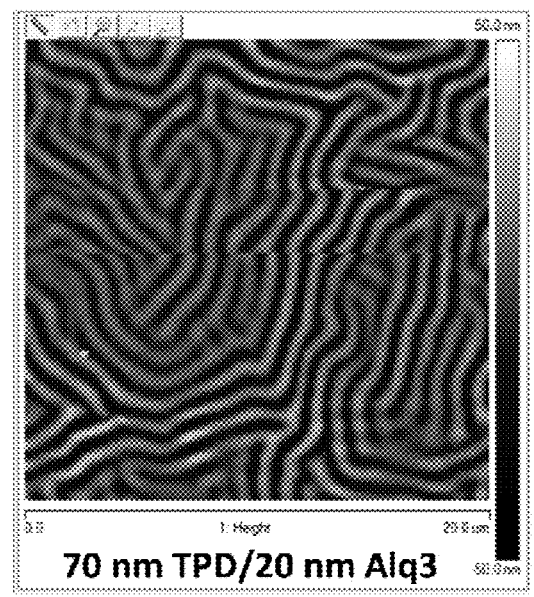

For example, in one example of this embodiment, the material of the first layer is TPD and the material of the second layer is Alq3; FIG. 6a and FIG. 6b show atomic force morphology microscopies of a double-layer structure with a scan size of 20 μm×20 μm, with a TPD hole transport layer (thickness 50 nm or 70 nm) (with a virtrification transition temperature of about 60° C., and a linear expansion coefficient at a temperature of 70° C. of about $1\times10^{-3}$ $K^{-1}$) as the first layer, and with a Alq3 electron transport layer (thickness 20 nm) (with a virtrification transition temperature of about 170° C., and a linear expansion coefficient at a temperature of 70° C. of about $3\times10^{-5}$ $K^{-1}$) as the second layer, after the double-layer structure is annealed at 70° C. for 30 minutes and then cooled to the room temperature. From FIG. 6a and FIG. 6b, it can be seen that, Rz is about 90 nm to 100 nm. In this case, the Alq$_3$ electron transport layer may also serve as a light emitting layer, so that the double-layer fold structure can emit light to form an organic light-emitting diode after the cathode and anode are incorporated.

For example, in the preparation method of the organic light-emitting diode provided by an example of this embodiment, the annealing time of the annealing process is greater than 20 mins. Limitation to the annealing time is intended to ensure sufficiency of the annealing process, in order to obtain a better fold morphology.

For example, in the preparation method of the organic light-emitting diode provided by an example of this embodiment, the thickness of the first layer is greater than the thickness of the second layer. Because at the annealing temperature, the thermal expansion coefficient of the first layer 101 is greater than the thermal expansion coefficient of the second layer, uniformity and periodicity of the formed fold can be ensured.

Figure 7A:
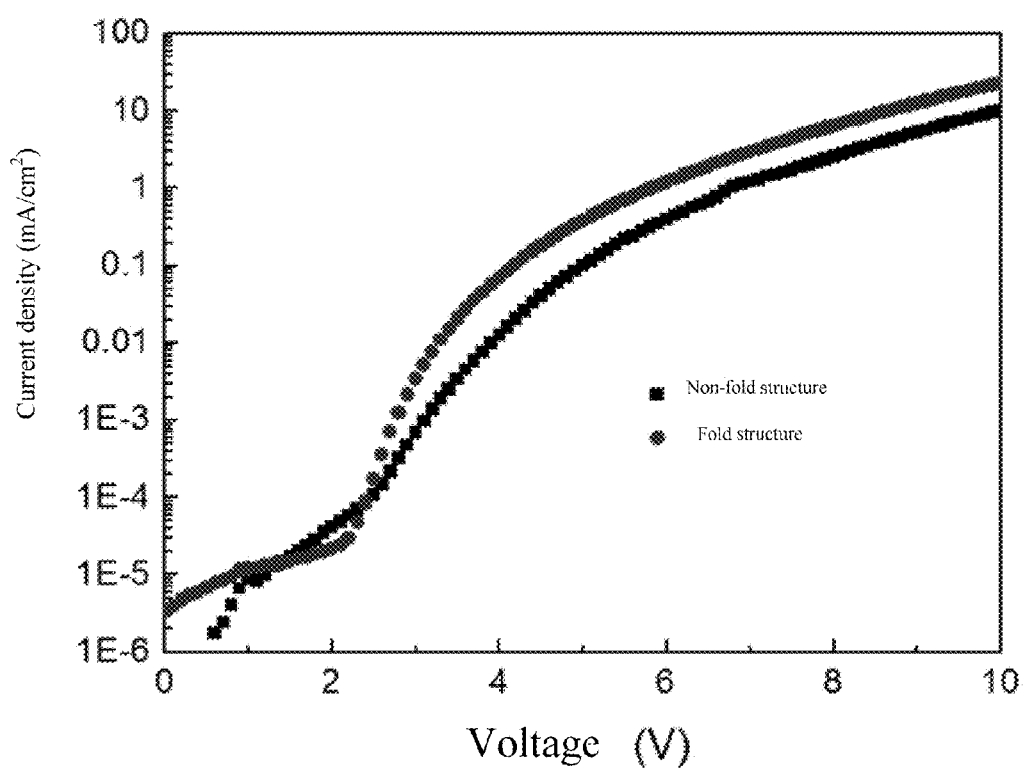
FIG. 7a is a schematic diagram of Voltage-Current density comparison between an OLED having a double-layer fold structure inside that is provided by an embodiment of the present disclosure and an OLED having no double-layer fold structure inside.
Figure 7B:
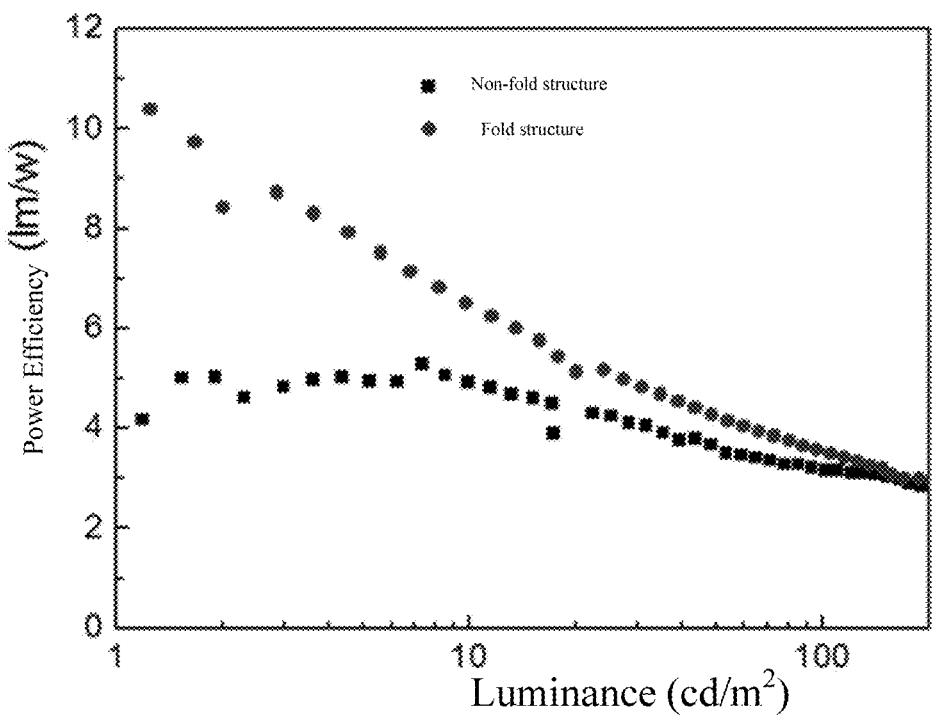
FIG. 7b is a schematic diagram of Luminance-Power Efficiency comparison between an OLED having a double-layer fold structure inside that is provided by an embodiment of the present disclosure and an OLED having no double-layer fold structure inside.

For example, in an example of this embodiment, the OLED includes: an ITO anode, an $MoO_x$ layer (thickness 5 nm) as a hole injection layer (HIL), an NPB layer as a hole transport layer (HTL) (thickness 30 nm), a CPB: 10 wt % $Ir(piq)_2(acac)$ layer (thickness 30 nm) as a light emitting layer (EML), a double-layer fold structure as an electron transport layer (ETL), and the double-layer fold structure includes a PBD layer (thickness 30 nm) as the first layer and an $Alq_3$ layer (thickness 15 nm) as the second layer, as well as an Al layer (thickness 70 nm) as a cathode. The OLED has the double-layer fold structure therein (the interface of the second layer closer to the first layer and the interface thereof farther away from the first layer both have a fold morphology, the first layer and the second layer are closely bonded to each other, and the surface of first layer closer to the second layer has a fold morphology), as compared with an OLED which does not has such a fold structure (whose remaining properties are all the same as the OLED having the fold structure, except that it does not have the fold structure), a voltage-current density curve and a luminance-power efficiency curve are respectively illustrated in FIG. 7a and FIG. 7b. In the luminance-power efficiency curve, under a luminous condition of 1 $cd/m^2$ to 100 $cd/m^2$, a power efficiency of the OLED having the fold structure inside is always higher than a power efficiency of the OLED provided with no fold structure.

Figure 8:
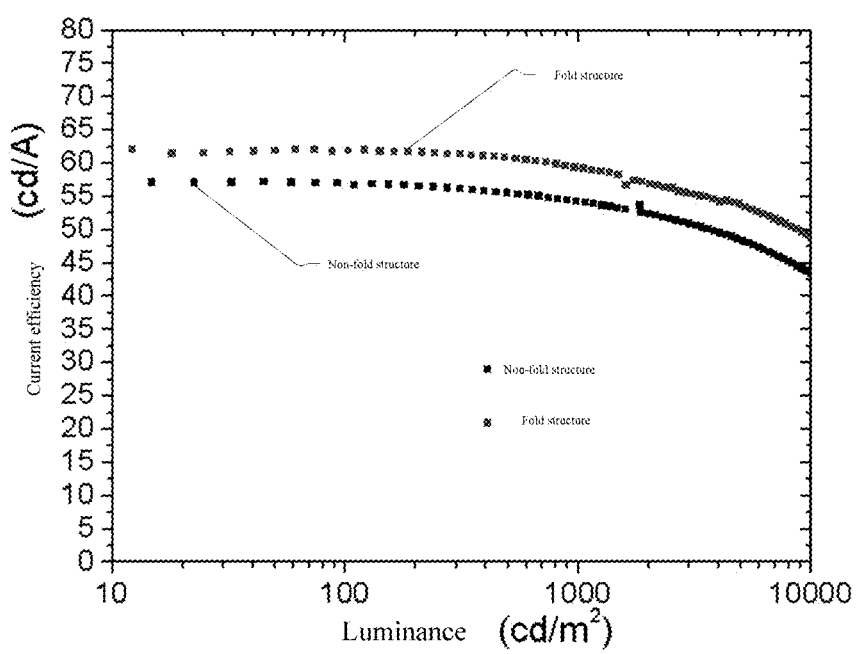
FIG. 8 is a schematic diagram of Luminance-Current Efficiency comparison between an OLED having a fold structure inside that is provided by an embodiment of the present disclosure and an OLED having no fold structure inside.

For example, in one example of this embodiment, the OLED comprises: Indium Tin Oxide (ITO) as an anode, an $MoO_x$ layer (thickness 10 nm) as a hole injection layer (HIL), a TPD layer (thickness 70 nm) as a hole transport layer (HTL) (as the first layer, the virtrification transition temperature is about 60° C., the annealing temperature is about 85° C., and at the annealing temperature, the linear expansion coefficient is about $1\times10^{-3}$ $K^{-1}$), a TcTa: 7 wt % $Ir(ppy)_3$ layer (thickness 45 nm) as a light emitting layer (EML, as the second layer, the virtrification transition temperature is about 150° C., the annealing temperature is about 85° C., and at the annealing temperature, the linear expansion coefficient is less than $5\times10^{-5}$ $K^{-1}$), a B3PymPm layer (thickness 50 nm) as an electron transport layer, a lithium fluoride layer (thickness 1 nm) as an electron injection layer, and an Al layer (thickness 70 nm) as a cathode. In the OLED according to this example, the morphology of the fold structure may be formed between the first layer and second layer. As illustrated in FIG. 8, as compared with the OLED which is not subjected to the annealing process (whose remaining properties are all the same as the OLED having the fold structure, except that it does not have the fold structure), under a same luminance condition, and in a case where the OLED has the internal fold structure, the OLED has a greater current efficiency; under a luminance condition of 1 $cd/m^2$ to 10000 $cd/m^2$, and in a case where the OLED includes a double-layer fold structure internally, its current efficiency is always greater than a current efficiency in a case where it does not have a double-layer fold structure internally. The arrangement of the internal double-layer fold structure of the organic light-emitting diode allows the current efficiency of the OLED to increase.

Thus, it can be concluded that, in the organic light-emitting diode provided by this embodiment, a natural and self-assembled fold morphology (the internal fold structure) is obtained with a double-layer thin film (e.g., a double-layer organic semiconductor thin film), to replace the external fold structure, resulting in a higher efficiency and a reduced operating voltage.

Embodiment Two

This embodiment provides an organic light-emitting diode display substrate, the display substrate comprising any organic light-emitting diode according to embodiment one. For an effect of the organic light-emitting diode display substrate, the effect of the corresponding organic light-emitting diode may be referred to.

Embodiment Three

This embodiment provides an organic light-emitting diode display device, the display device comprising any display substrate according to embodiment two. For an effect of the organic light-emitting diode display device, the effect of the corresponding organic light-emitting diode may be referred to.

For example, the display device may be a mobile phone, a tablet personal computer, a television, a monitor, a laptop, a digital photo frame, a navigator, a watch, and any other product or component having a display function.

There are some points to be illustrated:

(1) Unless otherwise defined, in the embodiments of the present disclosure and the accompanying drawings, a same reference sign denotes a same meaning.

(2) Drawings of the embodiments of the present disclosure only refer to structures related with the embodiments of the present disclosure, and general designs may be referred to for other structures.

(3) In order to make it clear, in the drawings for illustrating the embodiment of the present disclosure, a thickness of a layer or a region is magnified. It should be understood that, when elements such as a layer, a film, a region or a substrate and the like are called to be "above" or "below" another element, the element may be directly located "on" or "beneath" the other element, or there may be an intermediate element.

(4) The substances used in the embodiments of the present disclosure are those conventionally used in the art, and in parentheses before or after the substance, an abbreviation or a full name represented by each abbreviation is given to facilitate understanding.

(5) Without conflict, the embodiments of the present disclosure and features in the embodiments may be combined with each other.

What are described above is related to the illustrative embodiments of the disclosure only and not limitative to the scope of the disclosure; any modifications or replacements that can be obviously made by those skilled in the related art based on the disclosure of the present application should be within the scope of the present application; the scopes of the disclosure are defined by the accompanying claims.

The application claims priority to the Chinese patent application No. 201610064237.5, filed Jan. 29, 2016, the entire disclosure of which is incorporated herein by reference as part of the present application.

What is claimed is:

1. An organic light-emitting diode, comprising:
a double-layer fold structure,
wherein the double-layer fold structure includes a first layer and a second layer adjacent to each other, an interface between the first layer and the second layer and a surface of the second layer farther away from the first layer have a fold morphology, a virtrification transition temperature of the first layer is less than a virtrification transition temperature of the second layer, and a thermal expansion coefficient of the first layer is greater than a thermal expansion coefficient of the second layer,
wherein a difference value between the virtrification transition temperature of the first layer and the virtrification transition temperature of the second layer is greater than 50° C., and
wherein the double-layer fold structure is formed in an annealing process at an annealing temperature that is 8° C. to 40° C. higher than the virtrification transition temperature of the first layer.

2. The organic light-emitting diode according to claim 1, further comprising a cathode and an anode, wherein, the double-layer fold structure is located between the cathode and the anode.

3. The organic light-emitting diode according to claim 2, wherein the cathode has a fold morphology.

4. The organic light-emitting diode according to claim 1, wherein the virtrification transition temperature of the first layer is less than or equal to 100° C., and the virtrification transition temperature of the second layer is greater than 100° C.

5. The organic light-emitting diode according to claim 1, wherein the thermal expansion coefficient of the first layer is greater than $1 \times 10^{-4}$ K$^{-1}$, and the thermal expansion coefficient of the second layer is less than $5 \times 10^{-5}$ K$^{-1}$.

6. The organic light-emitting diode of claim 1, wherein a thickness of the first layer is greater than a thickness of the second layer.

7. The organic light-emitting diode according to claim 6, wherein the first layer has a thickness of 20 nm to 100 nm, and the second layer has a thickness of 10 nm to 50 nm.

8. The organic light-emitting diode according to claim 1, wherein a material of the first layer includes any one of a material of a charge transport layer, a material of a charge injection layer, and a material of a light emitting layer; and
a material of the second layer includes any one of the material of the charge transport layer, the material of the charge injection layer and the material of the light emitting layer.

9. The organic light-emitting diode according to claim 8, wherein the double-layer fold structure includes any one pair of hole injection layer/hole injection layer, hole injection layer/hole transport layer, hole transport layer/hole transport layer, hole injection layer/light emitting layer, hole transport layer/light emitting layer, light emitting layer/light emitting layer, light emitting layer/electron transport layer, electron transport layer/electron transport layer, electron transport layer/electron injection layer, and electron injection layer/electron injection layer.

10. The organic light-emitting diode according to claim 9, wherein the double-layer fold structure includes any one of N,N'-bis (3-methylphenyl)-N,N'-diphenyl-1,1'-diphenyl-4,4'-diamine (TPD)/4,4',4"-tris(carbazole-9-yl)triphenylamine (TcTa), N,N'-bis (3-methylphenyl)-N,N'-diphenyl-1,1'-diphenyl-4,4'-diamine (TPD)/4,4',4"-tris(carbazole-9-yl)triphenylamine (TcTa) doped with a light-emitting material, 2-(4-diphenyl)-5-(4-tert-butylphenyl)-1,3,4-oxadiazol (PBD)/8-hydroxyquinoline aluminum (Alq$_3$), and N,N'-bis (3-methylphenyl)-N,N'-diphenyl-1,1'-diphenyl-4,4'-diamine (TPD)/8-hydroxyquinoline aluminum (Alq$_3$).

11. The organic light-emitting diode according to claim 1, wherein the first layer and the second layer are of a small molecular compound or polymer.

12. The organic light-emitting diode according to claim 1, wherein a ratio (Rz) of peak to valley height in a case of roughness being maximum is greater than 20 nm and less than 1 μm, and a plane period of the fold morphology is 100 nm to 10 μm.

13. An organic light-emitting diode display substrate, comprising the organic light-emitting diode according to claim 1.

14. An organic light-emitting diode display device, comprising the organic light-emitting diode display substrate according to claim 13.

15. The organic light-emitting diode according to claim 1, wherein the annealing temperature of the annealing process is 10° C. to 30° C. higher than the virtrification transition temperature of the first layer.

16. A preparation method of an organic light-emitting diode, comprising:
forming a first layer and a second layer adjacent to each other; and
performing an annealing process thereon, so that an interface between the first layer and the second layer and a surface of the second layer farther away from the first layer form a fold morphology, a virtrification transition temperature of the first layer being less than a virtrification transition temperature of the second layer, and a thermal expansion coefficient of the first layer being greater than a thermal expansion coefficient of the second layer,
wherein a difference value between the virtrification transition temperature of the first layer and the virtrification transition temperature of the second layer is greater than 50° C. and
wherein an annealing temperature of the annealing process is 8° C. to 40° C. higher than the virtrification transition temperature of the first layer.

17. The preparation method of the organic light-emitting diode according to claim 16, further comprising:
controlling the fold morphology by controlling at least one of the annealing temperature of the annealing process, materials of the first layer and the second layer, and thicknesses of the first layer and the second layer.

18. The preparation method of the organic light-emitting diode according to claim 16, wherein the annealing temperature of the annealing process is 10° C. to 30° C. higher than the virtrification transition temperature of the first layer.

19. The preparation method of the organic light-emitting diode according to claim 16, wherein a thickness of the first layer is greater than a thickness of the second layer.

20. The preparation method of the organic light-emitting diode according to claim 16, wherein the annealing process is performed under a protective atmosphere.

* * * * *